United States Patent
Li

(10) Patent No.: US 10,777,581 B2
(45) Date of Patent: Sep. 15, 2020

(54) METHOD FOR MANUFACTURING IGZO THIN-FILM TRANSISTOR

(71) Applicant: WUHAN CHINA STAR OPTOELECTRONICS TECHNOLOGY CO., LTD., Wuhan, Hubei (CN)

(72) Inventor: Songshan Li, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 186 days.

(21) Appl. No.: 15/550,142

(22) PCT Filed: Jul. 6, 2017

(86) PCT No.: PCT/CN2017/092002
§ 371 (c)(1),
(2) Date: Jun. 12, 2018

(87) PCT Pub. No.: WO2018/223476
PCT Pub. Date: Dec. 13, 2018

(65) Prior Publication Data
US 2019/0386035 A1    Dec. 19, 2019

(30) Foreign Application Priority Data
Jun. 6, 2017    (CN) .......................... 2017 1 0418690

(51) Int. Cl.
*H01L 27/12*    (2006.01)
*H01L 27/32*    (2006.01)
(Continued)

(52) U.S. Cl.
CPC ...... *H01L 27/1225* (2013.01); *H01L 27/3246* (2013.01); *H01L 29/0847* (2013.01);
(Continued)

(58) Field of Classification Search
CPC ............. H01L 27/1225; H01L 27/3246; H01L 29/0847; H01L 31/022475;
(Continued)

(56) References Cited

U.S. PATENT DOCUMENTS 8,455,868 B2 *    6/2013   Yamazaki ............... H01L 29/24
                                                 257/43
8,471,256 B2 *    6/2013   Yamazaki ........... H01L 27/1225
                                                 257/59
(Continued)

FOREIGN PATENT DOCUMENTS

CN        102646632 A        8/2012
CN        103489827 A    *   1/2014    ......... H01L 45/1891

*Primary Examiner* — Alexander O Williams

(57) ABSTRACT

A method for manufacturing an IGZO thin-film transistor includes: manufacturing a buffer layer, an active layer, a gate electrode layer, and a gate insulator layer in sequence on a substrate, and performing a patterning process; depositing a transparent insulating metal oxide layer on the patterned buffer layer, the active layer, the gate electrode layer, and the gate insulator layer by sputtering, and annealing the transparent insulating metal oxide layer so as to improve electric properties of a thin-film transistor; depositing a dielectric layer on the transparent insulating metal oxide layer, and patterning the dielectric layer and the transparent insulating metal oxide layer by means of a photolithography process and a dry etch process; depositing S/D (source/drain) contact regions on the dielectric layer; and performing a patterning process.

17 Claims, 2 Drawing Sheets

(51) Int. Cl.
    *H01L 29/08*     (2006.01)
    *H01L 29/417*     (2006.01)
    *H01L 31/0224*     (2006.01)

(52) U.S. Cl.
    CPC ................. *H01L 29/41733* (2013.01); *H01L 31/022475* (2013.01)

(58) Field of Classification Search
    CPC ............... H01L 29/41733; H01L 29/24; H01L 29/78618; H01L 29/69969; H01L 29/7869; H01L 27/12; H01L 27/32; H01L 29/417; H01L 31/0224; H01L 29/08
    USPC .......................................................... 257/43
    See application file for complete search history.

(56) References Cited

U.S. PATENT DOCUMENTS

| | | | | |
|---|---|---|---|---|
| 8,552,423 | B2* | 10/2013 | Yamazaki | H01L 27/124 257/43 |
| 8,673,426 | B2* | 3/2014 | Yamazaki | H01L 27/1225 428/142 |
| 8,835,918 | B2* | 9/2014 | Yamazaki | H01L 29/7869 257/43 |
| 9,337,344 | B2* | 5/2016 | Hanaoka | H01L 29/7869 |
| 9,459,102 | B2* | 10/2016 | Rathi | G01C 21/362 |
| 9,691,905 | B2* | 6/2017 | Ito | H01L 29/78693 |
| 9,905,657 | B2* | 2/2018 | Endo | H01L 27/1225 |
| 9,911,756 | B2* | 3/2018 | Yamazaki | H01L 23/544 |
| 9,954,003 | B2* | 4/2018 | Matsuda | H01L 27/1222 |
| 9,954,113 | B2* | 4/2018 | Shimomura | H01L 29/78696 |
| 10,038,100 | B2* | 7/2018 | Yamazaki | H01L 29/7869 |
| 10,096,720 | B2* | 10/2018 | Ando | H01L 27/1222 |
| 10,115,742 | B2* | 10/2018 | Yamazaki | H01L 27/1225 |
| 10,438,982 | B2* | 10/2019 | Kurata | H01L 27/1259 |
| 2010/0025675 | A1* | 2/2010 | Yamazaki | H01L 29/66742 257/43 |
| 2010/0301328 | A1* | 12/2010 | Yamazaki | H01L 29/78609 257/43 |
| 2011/0095288 | A1 | 4/2011 | Morosawa et al. | |
| 2011/0240998 | A1 | 10/2011 | Morosawa et al. | |
| 2012/0241744 | A1 | 9/2012 | Tokunaga | |
| 2016/0218124 | A1* | 7/2016 | Wang | H01L 27/124 |
| 2018/0033979 | A1* | 2/2018 | Jang | B32B 27/18 |

* cited by examiner

METHOD FOR MANUFACTURING IGZO THIN-FILM TRANSISTOR

CROSS-REFERENCE TO RELATED APPLICATIONS

This application claims the priority of Chinese patent application CN 201710418690.6, entitled "Method for manufacturing IGZO thin-film transistor" and filed on Jun. 6, 2017, the entirety of which is incorporated herein by reference.

FIELD OF THE INVENTION

The present disclosure relates to the technical field of display, and in particular, to a method for manufacturing an IGZO thin-film transistor.

BACKGROUND OF THE INVENTION

IGZO (Indium Gallium Zinc Oxide) semiconductors have attracted broad attention because of their advantages such as high electron mobility, low leakage current, and low temperature required for preparation. For a traditional top-gate self-aligned structure, after an active layer, a gate electrode layer, and a gate insulator layer are patterned, plasmas (Ar, He, N2, etc.) are used to make S/D (source/drain) contact regions conductive so as to reduce impedance. However, in a subsequent annealing process, impedance in the regions may recover gradually, which affects the carrier transport. As a result, electric properties of a thin-film transistor are affected.

SUMMARY OF THE INVENTION

In view of the above-mentioned problems, the present disclosure provides a method for manufacturing an IGZO thin-film transistor.

In order to achieve the above objective, the present disclosure provides a method for manufacturing an IGZO thin-film transistor. The method comprises following steps.

A buffer layer, an active layer, a gate electrode layer, and a gate insulator layer are manufactured in sequence on a substrate, and are treated with a patterning process.

A transparent insulating metal oxide layer is deposited on the processed buffer layer, the active layer, the gate electrode layer, and the gate insulator layer by sputtering, and is treated with an annealing process so as to improve electric properties of a thin-film transistor.

A dielectric layer is deposited on the transparent insulating metal oxide layer, and the dielectric layer and the transparent insulating metal oxide layer are patterned by means of a photolithography process and a dry etch process.

A source electrode and a drain electrode are deposited on the dielectric layer, and are treated with the patterning process.

A passivation layer and a planarization layer are formed on the dielectric layer, and are treated with the patterning process.

An ITO (Indium Tin Oxide) electrode and a pixel defining layer are manufactured and on the passivation layer and the planarization layer, and are treated with the patterning process.

An organic light emitting component is manufactured on the ITO electrode.

According to the method for manufacturing an IGZO thin-film transistor, the transparent insulating metal oxide layer is diffused towards a surface of the active layer during annealing, for increasing a carrier concentration on the surface of the active layer so that S/D contact regions become conductive, and impedance of the S/D contact regions would not recover in the subsequent annealing process. The transparent insulating metal oxide layer functions as a barrier layer to prevent an influence of water and oxygen on the active layer, and thus the electric properties of the thin-film transistor can be improved.

According to the method for manufacturing an IGZO thin-film transistor, a thickness of the transparent insulating metal oxide layer is from 8 nm to 12 nm.

According to the method for manufacturing an IGZO thin-film transistor, the thickness of the transparent insulating metal oxide layer is 10 nm.

According to the method for manufacturing an IGZO thin-film transistor, an annealing temperature is from 280° C. to 320° C.

According to the method for manufacturing an IGZO thin-film transistor, the annealing temperature is 300° C.

According to the method for manufacturing an IGZO thin-film transistor, the transparent insulating metal oxide layer is annealed once again.

According to the method for manufacturing an IGZO thin-film transistor, the transparent insulating metal oxide layer is made of alumina.

In the above-mentioned technical solution, according to the method for manufacturing an IGZO thin-film transistor provided by the present disclosure, as compared with the prior art, a thin transparent insulating metal oxide layer is deposited by sputtering followed by an annealing process, and then the aluminum is diffused towards a surface of an IGZO semiconductor layer. Thus, S/D contact regions become conductive, and impedance of the S/D contact regions would not recover. In this manner, electric properties of the thin-film transistor can be greatly improved. The technical features described above may be combined in various suitable ways or replaced by equivalent technical features as long as the object of the present disclosure can be achieved.

BRIEF DESCRIPTION OF THE DRAWINGS

The present disclosure will be described in a more detailed way below based on embodiments and with reference to the accompanying drawings, in which.

In the accompanying drawings, same components use same reference signs. The accompanying drawings are not drawn according to actual proportions.

DETAILED DESCRIPTION OF THE EMBODIMENTS

The details of the present disclosure can be understood more clearly combining the description on the drawings and the embodiments. However, the specific embodiments disclosed herein are only used for illustrating the present disclosure, while cannot be understood as limiting the present disclosure in any manner. Those skilled in the art can make any deformations under the teaching of the technical content disclosed herein, and all the deformations fall into the scope of the present disclosure. The present disclosure will be further illustrated hereinafter with reference to the drawings.

Figure 1:
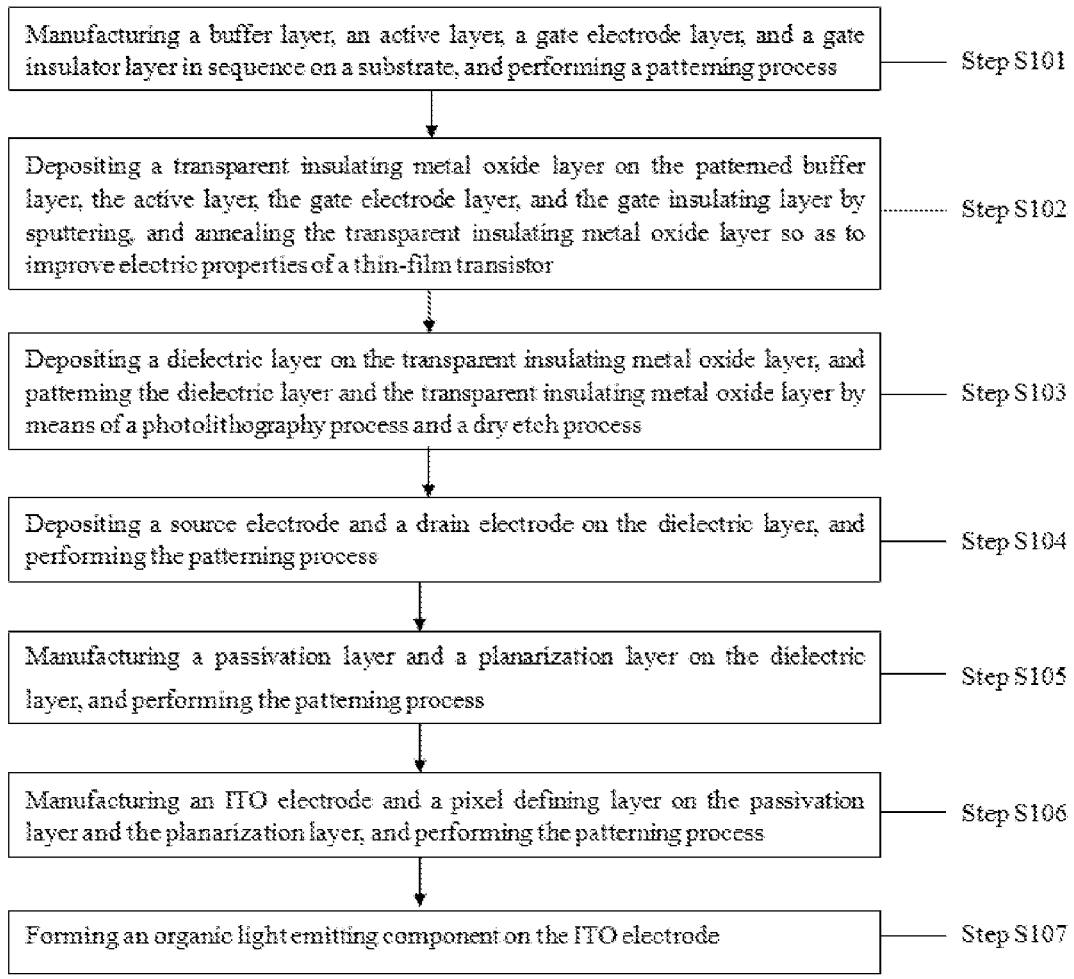
FIG. 1 shows a flowchart of a method for manufacturing an IGZO thin-film transistor according to one embodiment of the present disclosure.

FIG. 1 shows a method for manufacturing an IGZO thin-film transistor. The method comprises following steps.

In Step S101, a buffer layer, an active layer (made of IGZO), a gate electrode layer, and a gate insulator layer are manufactured in sequence on a substrate, and are treated with a patterning process.

In Step S102, a transparent insulating metal oxide layer (made of $Al_2O_3$) is deposited on the patterned buffer layer, the active layer, the gate electrode layer, and the gate insulator layer by sputtering, and is treated with an annealing process so as to improve electric properties of a thin-film transistor.

In Step S103, an ILD (inter layer dielectric) layer (made of SiOx) is deposited on the transparent insulating metal oxide layer, and the ILD layer and the transparent insulating metal oxide layer are patterned by means of a photolithography process and a dry etch process.

In Step S104, S/D (Mo/Al/M0) electrodes are deposited on the ILD layer, and are treated with the patterning process.

In Step S105, a passivation layer and a planarization layer are formed on the ILD layer, and are treated with the patterning process.

In Step S106, an ITO electrode and a pixel defining layer are formed on the passivation layer and the planarization layer, and are treated with the patterning process.

In Step S107, an organic light emitting component is manufactured on the ITO electrode.

In one embodiment, the transparent insulating metal oxide layer is diffused towards a surface of the active layer during annealing, for increasing a carrier concentration on the surface of the active layer so that S/D contact regions become conductive, and conductivity of the S/D contact regions would not be weakened in the subsequent annealing process. The transparent insulating metal oxide layer functions as a barrier layer to prevent an influence of water ($H_2O$) and oxygen ($O_2$) on the active layer. Besides, impedance would not recover, and thus electric properties of the thin-film transistor can be improved.

In one embodiment, a thickness of the transparent insulating metal oxide layer is from 8 nm to 12 nm, and preferably is 10 nm.

In one embodiment, an IGZO semiconductor layer with the transparent insulating metal oxide layer, the gate electrode layer, and the gate insulator layer are treated with the annealing process.

In one preferred embodiment, an annealing temperature is from 280° C. to 320° C.

In one preferred embodiment, the annealing temperature is preferably 300° C.

In one embodiment, the transparent insulating metal oxide layer is treated with the annealing process once again.

In one embodiment, the transparent insulating metal oxide layer is made of alumina or other transparent insulating metal oxides.

Figure 2:
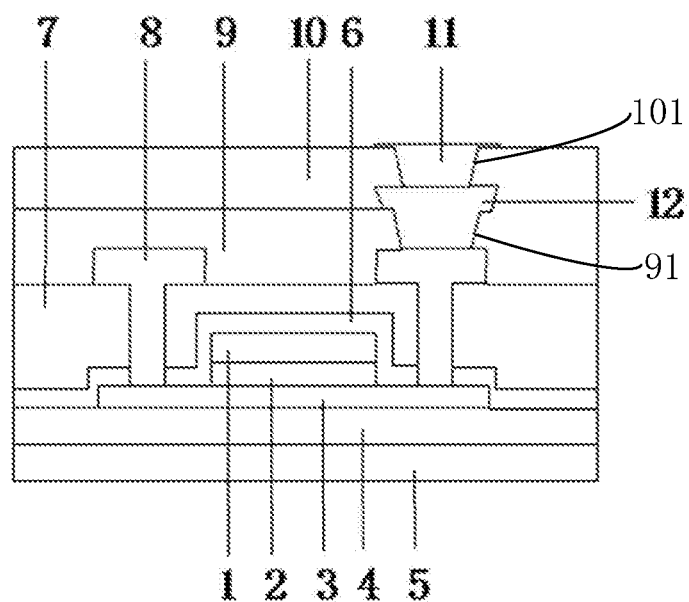
FIG. 2 schematically shows a structure of an IGZO thin-film transistor according to one embodiment of the present disclosure.

FIG. 2 shows specific use of the method.

A buffer layer 4, an active layer 3, a gate insulator layer 2, and a gate electrode layer 1 (using an Al+Mo structure) are manufactured in sequence on a substrate 5, and are patterned by using a lithography process.

A thin transparent insulating metal oxide layer 6 (about 10 nm) is deposited by physical vapor deposition (PVD), and then is treated with an annealing process at a temperature of about 300° C. At this point, the transparent insulating metal oxide layer 6 is diffused towards a surface of the active layer 3, and thus a carrier concentration on the surface of the active layer 3 is increased. In this manner, S/D 8 contact regions are made conductive.

An ILD (inter layer dielectric) layer (made of SiOx) 7 is deposited, and then the ILD layer 7 and the transparent insulating metal oxide layer 6 are patterned by means of a photolithography process and a dry etch process. Subsequently, S/D 8 electrodes (Mo/Al/M0) are deposited and are patterned.

A passivation layer and a planarization layer 9 are manufactured on the ILD layer, and are treated with a patterning process to form a first via hole 91.

An ITO (Indium Tin Oxide) electrode 12 is manufactured and patterned, and a pixel defining layer 10 is manufactured and patterned to form a second via hole 101.

An OLED (Organic Light Emitting Diode) material is treated with an evaporation process to complete the production of an OLED component.

The thin transparent insulating metal oxide layer 6 (made of $Al_2O_3$) is deposited by sputtering, followed by an annealing process. In the subsequence annealing process, aluminum (Al) in the transparent insulating metal oxide layer 6 is diffused towards a surface of the active layer 3 (made of IGZO) so that a carrier concentration on the surface of the active layer 3 is increased. Thus, S/D 8 contact regions become conductive, and conductivity of the S/D 8 contact regions would not be weakened in the subsequent annealing process. Meanwhile, the transparent insulating metal oxide layer 6 functions as a barrier layer to prevent an influence of water ($H_2O$) and oxygen ($O_2$) on the active layer 3, and thus electric properties of the thin-film transistor (TFT) can be improved greatly.

The present disclosure is illustrated in detail in combination with preferred embodiments hereinabove, but it can be understood that the embodiments disclosed herein can be improved or substituted without departing from the protection scope of the present disclosure. In particular, as long as there are no structural conflicts, the technical features disclosed in each and every embodiment of the present disclosure can be combined with one another in any way, and the combined features formed thereby are within the protection scope of the present disclosure. The present disclosure is not limited by the specific embodiments disclosed herein, but includes all technical solutions falling into the protection scope of the claims.

The invention claimed is:

1. A method for manufacturing an IGZO (Indium Gallium Zinc Oxide) thin-film transistor, wherein the method comprises the following steps:
    step S101: manufacturing a buffer layer, an active layer, a gate electrode layer, and a gate insulator layer in sequence on a substrate, and performing a patterning process;
    step S102: depositing a transparent insulating metal oxide layer on the patterned buffer layer, the active layer, the gate electrode layer, and the gate insulator layer by sputtering, and annealing the transparent insulating metal oxide layer such that aluminum in the transparent insulating metal oxide layer made of alumina is diffused towards a surface of the active layer made of indium gallium zinc oxide;
    step S103: depositing a dielectric layer on the transparent insulating metal oxide layer, and patterning the dielectric layer and the transparent insulating metal oxide layer by means of a photolithography process and a dry etch process; and step S104: depositing S/D (source/drain) contact regions on the dielectric layer, and performing a patterning process.

2. The method for manufacturing AN IGZO thin-film transistor according to claim 1, wherein
in step S102, the transparent insulating metal oxide layer is diffused towards a surface of the active layer during annealing, for increasing a carrier concentration on the surface of the active layer so that the S/D contact regions become conductive, and conductivity of the S/D contact regions would not be weakened in a subsequent annealing process; and
the transparent insulating metal oxide layer functions as a barrier layer to prevent an influence of water and oxygen on the active layer, thereby improving the electric properties of the thin-film transistor.

3. The method for manufacturing an IGZO thin-film transistor according to claim 2, wherein a thickness of the transparent insulating metal oxide layer is from 8 nm to 12 nm.

4. The method for manufacturing an IGZO thin-film transistor according to claim 3, wherein the thickness of the transparent insulating metal oxide layer is 10 nm.

5. The method for manufacturing an IGZO thin-film transistor according to claim 1, wherein in step S102, an annealing temperature is from 280° C. to 320° C.

6. The method for manufacturing an IGZO thin-film transistor according to claim 5, wherein the annealing temperature is 300° C.

7. The method for manufacturing an IGZO thin-film transistor according to claim 1, wherein in S102, the transparent insulating metal oxide layer is annealed once again.

8. The method for manufacturing an IGZO thin-film transistor according to claim 1, wherein the method further comprises forming a passivation layer and a planarization layer on the dielectric layer and performing a patterning process to form a first via hole.

9. The method for manufacturing an IGZO thin-film transistor according to claim 8, wherein the method further comprises:
forming an ITO (Indium Tin Oxide) electrode in the first via hole and a pixel defining layer on the passivation layer and the planarization layer and the ITO electrode, and performing a patterning process to form a second via hole; and
forming an organic light emitting component in the second via hole on the ITO electrode.

10. The method for manufacturing an IGZO thin-film transistor according to claim 2, wherein in S102, the transparent insulating metal oxide layer is annealed once again.

11. The method for manufacturing an IGZO thin-film transistor according to claim 2, wherein the method further comprises forming a passivation layer and a planarization layer on the dielectric layer and performing a patterning process to form a first via hole.

12. The method for manufacturing an IGZO thin-film transistor according to claim 11, wherein the method further comprises:
forming an ITO (Indium Tin Oxide) electrode in the first via hole and a pixel defining layer the passivation layer and the planarization layer and the ITO electrode, and performing a patterning process to form a second via hole; and
forming an organic light emitting component in the second via hole on the ITO electrode.

13. The method for manufacturing an IGZO thin-film transistor according to claim 8, wherein
in step S102, the transparent insulating metal oxide layer is diffused towards a surface of the active layer during annealing, for increasing a carrier concentration on the surface of the active layer so that the S/D contact regions become conductive, and conductivity of the S/D contact regions would not be weakened in a subsequent annealing process; and
the transparent insulating metal oxide layer functions as a barrier layer to prevent an influence of water and oxygen on the active layer, thereby improving the electric properties of the thin-film transistor.

14. The method for manufacturing an IGZO thin-film transistor according to claim 9, wherein the first via hole is defined corresponding to one electrode of S/D electrodes such that the ITO electrode is connected to the one electrode of the S/D electrodes.

15. The method for manufacturing an IGZO thin-film transistor according to claim 9, wherein the second via hole is defined corresponding to the first via hole such that the organic light emitting component is connected to the ITO electrode.

16. The method for manufacturing an IGZO thin-film transistor according to claim 12, wherein the first via hole is defined corresponding to one electrode of S/D electrodes such that the ITO electrode is connected to the one electrode of the S/D electrodes.

17. The method for manufacturing an IGZO thin-film transistor according to claim 12, wherein the second via hole is defined corresponding to the first via hole such that the organic light emitting component is connected to the ITO electrode.

* * * * *